United States Patent
Goktepeli et al.

(10) Patent No.: US 10,522,626 B2
(45) Date of Patent: Dec. 31, 2019

(54) SILICON-ON-INSULATOR BACKSIDE CONTACTS

(71) Applicant: QUALCOMM Incorporated, San Diego, CA (US)

(72) Inventors: Sinan Goktepeli, San Diego, CA (US); George Pete Imthurn, San Diego, CA (US); Yun Han Chu, San Diego, CA (US); Qingqing Liang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/993,679

(22) Filed: May 31, 2018

(65) Prior Publication Data
US 2019/0371890 A1 Dec. 5, 2019

(51) Int. Cl.
| | | |
|---|---|---|
| *H01L 29/10* | (2006.01) | |
| *H01L 27/12* | (2006.01) | |
| *H01L 21/285* | (2006.01) | |
| *H01L 21/84* | (2006.01) | |
| *H01L 21/74* | (2006.01) | |
| *H01L 29/45* | (2006.01) | |

(52) U.S. Cl.
CPC .... *H01L 29/1087* (2013.01); *H01L 21/28518* (2013.01); *H01L 21/743* (2013.01); *H01L 21/84* (2013.01); *H01L 27/1203* (2013.01); *H01L 29/45* (2013.01)

(58) Field of Classification Search
CPC .......................... H01L 29/1087; H01L 29/45
See application file for complete search history.

(56) References Cited

U.S. PATENT DOCUMENTS

| | | | | |
|---|---|---|---|---|
| 4,902,637 A | * | 2/1990 | Kondou | H01L 21/76248 438/152 |
| 7,285,477 B1 | | 10/2007 | Bernstein et al. | |
| 8,552,487 B2 | * | 10/2013 | Doris | H01L 27/10829 257/304 |
| 9,171,887 B2 | * | 10/2015 | Yokoyama | H01L 21/823431 |
| 2008/0083941 A1 | * | 4/2008 | Cheng | H01L 21/743 257/301 |
| 2010/0181547 A1 | | 7/2010 | Kuroda | |
| 2018/0061766 A1 | | 3/2018 | Goktepeli | |

OTHER PUBLICATIONS

Partial International Search Report—PCT/US2019/030998—ISA/EPO—dated Aug. 21, 2019.

* cited by examiner

*Primary Examiner* — Matthew L Reames
(74) *Attorney, Agent, or Firm* — Qualcomm Incorporated

(57) ABSTRACT

In certain aspects, an apparatus comprises an SOI MOSFET having a diffusion region as a source or a drain on a back insulating layer, wherein the diffusion region has a front diffusion side and a back diffusion side opposite to the front diffusion side; a silicide layer on the front diffusion side having a back silicide side facing the diffusion region and a front silicide side opposite to the back silicide side; and a backside contact connected to the silicide layer, wherein at least a portion of the backside contact is in the back insulating layer.

10 Claims, 12 Drawing Sheets

SILICON-ON-INSULATOR BACKSIDE CONTACTS

BACKGROUND

Field

Aspects of the present disclosure relate to silicon-on-insulator devices, and more particularly, to structures and manufacturing methods for silicon-on-insulator backside contacts.

Background

Silicon-on-insulator (SOI) technology refers to the use of a layered silicon-insulator-silicon substrate in place of a conventional silicon substrate in semiconductor manufacturing, especially microelectronics, to reduce parasitic device capacitance, thereby improving performance. An integrated circuit built using SOI devices may show processing speed that is approximately 30% faster than a comparable bulk-based integrated circuit and power consumption being reduced by as much as 80%, which makes it ideal for mobile devices. SOI chips also reduce the soft error rate, which is data corruption caused by cosmic rays and natural radioactive background signals. SOI transistors offer a unique opportunity for CMOS architectures to be more scalable. The buried oxide layer (back insulating layer) limits the punch-through that may exist on deep sub-micron bulk devices.

In some examples, a layer transfer process is used to transfer a top active device portion of an SOI wafer to a handle wafer. In this process, the top portion of the SOI wafer is bonded to the handle wafer, and the bulk substrate layer (the sacrificial substrate) of the SOI wafer is removed. The process enables a backside connection system to be formed, in addition to a frontside connection system. For example, the back insulating layer may be thinned down. Openings may be formed in the back insulating layer so that backside contacts may be formed to connect to devices, such as a MOSFET's source, drain, and/or body. In addition, one or more metal layers and vias may be formed on the back insulating layer to route powers, grounds, and/or signals to the devices. The backside contacts and one or more metal layers and vias form the backside connection system as compared to frontside contacts and metal layers and vias in the frontside connection system. Source and drain silicide is often required to facilitate good connection between frontside or backside connection system with the devices. Conventionally, a dual-side silicidation process may be needed, forming a frontside silicide layer in the front of the source or drain for connection to the frontside connection system, and a backside silicide layer in the back of the source or drain for connection to the backside connection system.

The backside silicide layer is formed after the formation of the devices and the frontside connection system. Consequently, forming the backside silicide layer may pose several issues. It increases process complexity, resulting in additional cost and yield loss. Higher thermal from extra silicidation process may have adverse effect on device performance and integrity of the frontside connection system. Accordingly, it would be beneficial to enable backside connection system without additional backside silicide layer.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, an apparatus comprises an SOI MOSFET having a diffusion region as a source or a drain on a back insulating layer, wherein the diffusion region has a front diffusion side and a back diffusion side opposite to the front diffusion side; a silicide layer on the front diffusion side having a back silicide side facing the diffusion region and a front silicide side opposite to the back silicide side; and a backside contact connected to the silicide layer, wherein at least a portion of the backside contact is in the back insulating layer.

In another aspect, a method comprises providing an SOI wafer having a back insulating layer, one or more MOSFETs on the back insulating layer each having a diffusion region as source or drain, and a frontside silicide layer on the diffusion region having a back silicide side facing the diffusion region and a front silicide side opposite to the back silicide side; forming a contact opening through the back insulating layer and a portion of the diffusion region; and forming a backside contact in the contact openings, wherein the backside contact connects to the frontside silicide layer by the back silicide side.

In another aspect, a method comprises providing an SOI wafer having a back insulating layer and one or more MOSFETs each having a diffusion region as source or drain of the MOSFET, wherein the diffusion region has a front diffusion side and a back diffusion side; forming a recess in a selected recess area in the diffusion region from the front diffusion side; forming a silicide layer in the diffusion region from the front diffusion side and the recess, wherein the silicide layer has a back silicide side facing the diffusion region and a front silicide side opposite to the back silicide side, and wherein the back silicide side touches the back insulating layer under the selected recess area; forming a contact opening in the back insulating layer; and forming a backside contact in the contact opening, wherein the backside contact connects to the silicide layer under the selected recess area by the back silicide side.

In another aspect, a method comprises providing an SOI wafer having a back insulating layer, one or more MOSFETs each having a diffusion region as source or drain of the MOSFET, and a shallow trench isolation opening adjacent to the diffusion region, wherein the diffusion region has a front diffusion side, a back diffusion side, and a sidewall, wherein the sidewall is also a sidewall of the shallow trench isolation opening; forming a silicide layer in the diffusion region from the front diffusion side and the sidewall, wherein the silicide layer touches the back insulating layer by the sidewall; forming a contact opening in the back insulating layer; and forming a backside contact in the contact opening, wherein the backside contact connects to the silicide layer by the sidewall.

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

Semiconductor-on-insulator (SOI) devices are widely used for their excellent electrical properties including lower threshold voltage, smaller parasitic capacitance, less current leakage and good switching property, etc. The layer transfer technology enables interconnect routing to be on both sides of the devices and is opening up new classes of materials, devices, integration and systems in the field of microelectronics, microelectromechanical systems (MEMS), optical devices, and optoelectronics.

Figure 1:
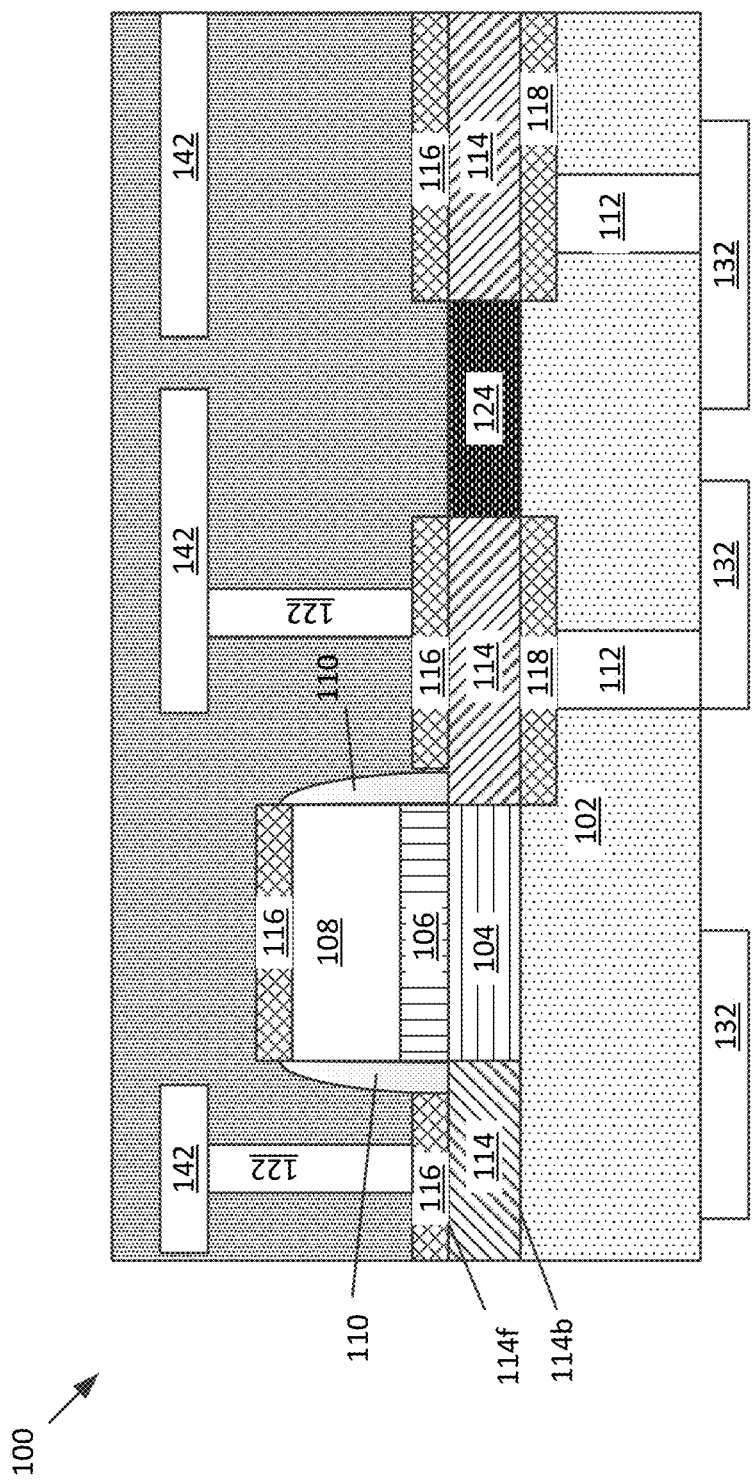
FIG. 1 illustrates an example dual-side silicide dual-side connection systems SOI device according to certain aspects of the present disclosure.

A dual-side silicidation process is typically required to facilitate the dual-side routing. FIG. 1 illustrates an example dual-side silicide dual-side connection systems SOI device according to certain aspects of the present disclosure. The SOI device 100 comprises a back insulating layer 102 (e.g., comprising $SiO_2$), one or more diffusion regions 114 (e.g., comprising N+ silicon for an NMOSFET or P+ silicon for a PMOSFET) on the back insulating layer 102 that may be sources or drains of MOSFETs, one or more body regions 104 (e.g., comprising P silicon for an NMOSFET or N silicon for a PMOSFET) as channels of the MOSFETs, and one or more shallow trench isolation regions 124 (e.g., comprising $SiO_2$). Each of the MOSFETs further comprises a gate insulating layer 106 (e.g., comprising $SiO_2$ or $H_fO$) on the body region 104, a gate conducting layer 108 (e.g., comprising polysilicon or metal) on the gate insulating layer 106, and a spacer 110 (e.g., SiN).

Each of the diffusion regions 114 has a front diffusion side 114f and a back diffusion side 114b. Each of the diffusion regions 114 is silicidized in the front diffusion side 114f to have a frontside silicide layer 116 (e.g., comprising CoSi or TiSi). The frontside silicide layers 116 may also be in and on the gate conducting layers 108. Some of the diffusion regions 114 are also silicidized in the back diffusion side 114b to have backside silicide layers 118. The frontside silicide layers 116 and the backside silicide layers 118 provide low resistive connection for source, drain, and gate for the MOSFETs.

The SOI device 100 further comprises one or more frontside contacts 122 (e.g., comprising W, Ti, Cu, or Al) connected to the respective frontside silicide layers 116 and one or more backside contacts 112 (e.g., comprising W, Ti, Cu, or Al) connected to the respective backside silicide layers 118. In addition, one or more front metal layers and vias 142 (e.g., comprising Cu or Al) coupled to the one or more frontside contacts 122, and together form a frontside connection system. Similarly, one or more back metal layers and vias 132 (e.g., comprising Cu or Al) coupled to the backside contacts 112 and together form a backside connection system.

The dual-side silicidation process shown in FIG. 1 enables a dual-side connection systems, allowing both a frontside connection system and a backside connection system in the same die. The technology, however, improves the circuit and interconnect density and routability at the cost of increased process complexity, higher thermal budget, potential yield loss, and potential performance degradation.

Figure 2:
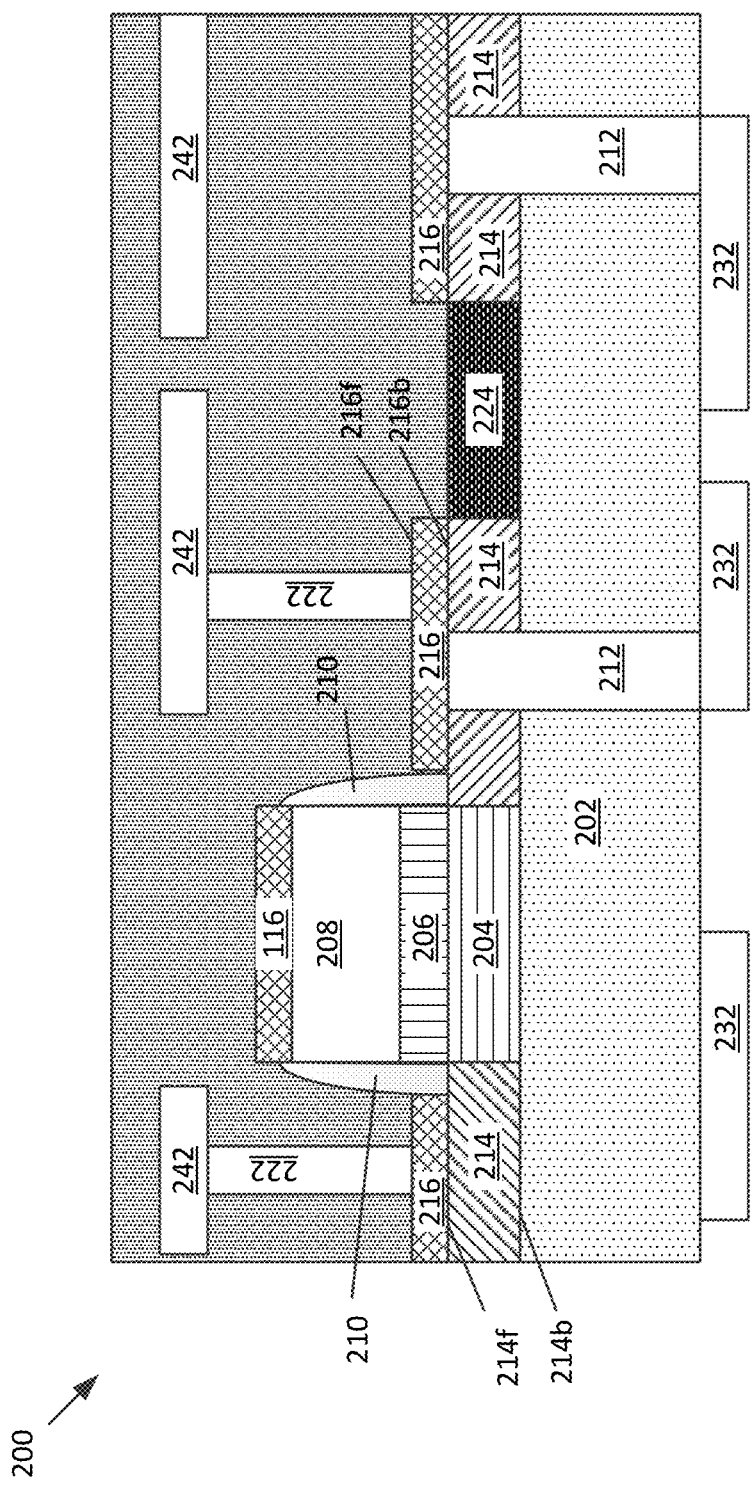
FIG. 2 illustrates an exemplary single-side silicide dual-side connection systems SOI device according to certain aspects of the present disclosure.

FIG. 2 illustrates an exemplary single-side silicide dual-side connection systems SOI device according to certain aspects of the present disclosure. Similar to the SOI device 100, the SOI device 200 comprises a back insulating layer 202 (e.g., comprising $SiO_2$), one or more diffusion regions 214 (e.g., comprising N+ silicon for an NMOSFET or P+ silicon for a PMOSFET) on the back insulating layer 202 that may be sources or drains of MOSFETs, one or more body regions 204 (e.g., comprising P silicon for an NMOSFET or N silicon for a PMOSFET) on the back insulating layer 202 as channels of the MOSFETs, and one or more shallow trench isolation regions 224 (e.g., comprising $SiO_2$). Each of the MOSFETs further comprises a gate insulating layer 206 (e.g., comprising $SiO_2$ or $H_fO$) on a respective one of the body regions 204, a gate conducting layer 208 (e.g., comprising polysilicon or metal) on the gate insulating layer 206, and a spacer 210 (e.g., SiN).

Each of the diffusion regions 214 has a front diffusion side 214f and a back diffusion side 214b. Each of the diffusion regions 214 is silicidized in the front diffusion side 214f to have a frontside silicide layer 216 (e.g., comprising CoSi or TiSi). Each of the frontside silicide layers 216 has a back silicide side 216b facing the respective one of the diffusion regions 214 and a front silicide side 216f opposite to the back silicide side 216b. The frontside silicide layers 216 also are in and on the respective one of the gate conducting layers 208. The frontside silicide layers 216 provide low resistive connection for source, drain, and/or gate contacts for the MOSFETs.

The SOI device 200 also comprises one or more frontside contacts 222 (e.g., comprising W, Ti, Cu, or Al) connected to the frontside silicide layers 216 by the front silicide side 216f. One or more front metal layers and vias 242 couple to the frontside contacts 222 and together form a frontside connection system. However, unlike the SOI device 100, the SOI device 200 does not comprise backside silicide layers. Instead, one or more backside contacts 212 (e.g., comprising W, Ti, Cu, or Al) are in both the back insulating layer 202 and the respective diffusion regions 214 and connect directly to the respective frontside silicide layers 216 by the back silicide side 216b. One or more back metal layers and vias 232 coupled to the backside contacts 212 and together form a backside connection system for the SOI device 200.

As illustrated in FIG. 2, for the backside contacts 212 to be connected low resistively with the diffusion regions 214, the backside contacts 212 must be through a portion of the diffusion regions 214 to reach the frontside silicide layers 216. A portion of the backside contacts 212 is surrounded by the diffusion regions 214 while a portion is surrounded by the back insulating layer 102. This requires selective diffusion silicon etching under the frontside silicide layers 216 for the etch to stop at the respective back silicide side 216b. Additional end-point sensing may be needed for control to avoid over or under etching.

As also illustrated in FIG. 2, not every frontside silicide layer has to couple to a frontside contacts. Likewise, not every frontside silicide layer has to couple to a backside contacts. In addition, a frontside silicide layer may couple to both a frontside contact and a backside contact or neither.

Both the frontside contacts 222 and the backside contacts 212 may comprise any suitable conductive material or materials, such as W, Ti, Al, or Cu. A conductive diffusion barrier may be formed along the sidewall of the frontside contacts and/or the backside contacts. For example, Ti/TiN liner may be formed along the sidewall of the frontside contacts and/or the backside contacts.

Figure 3A:
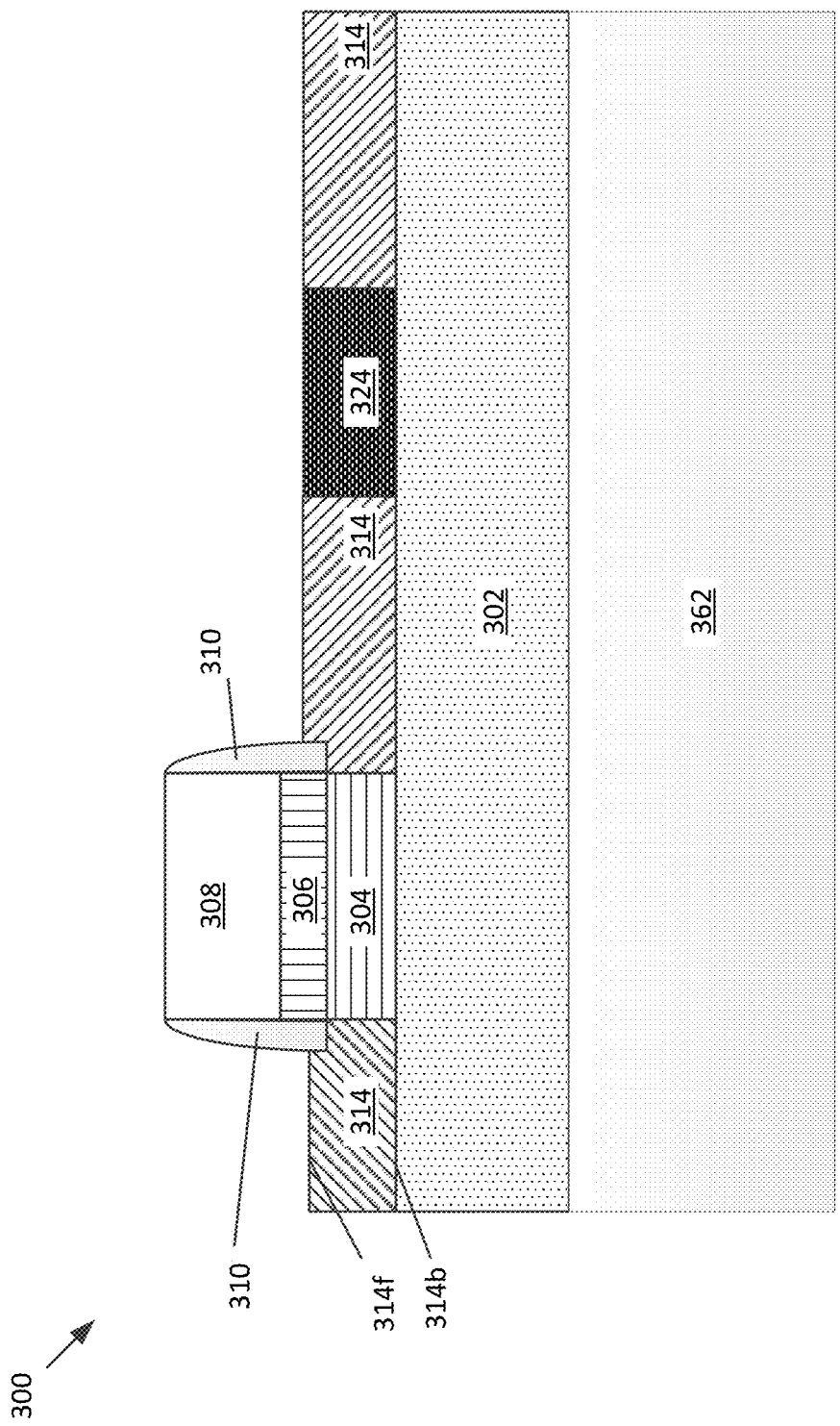
FIGS. 3a-3d illustrate another exemplary single-side silicide dual-side connection systems SOI device according to certain aspects of the present disclosure.

FIGS. 3a-3d illustrate another exemplary single-side silicide dual-side connection systems SOI device according to certain aspects of the present disclosure. In FIG. 3a, a starting SOI wafer is provided. The starting SOI wafer comprises a sacrificial substrate 362, a back insulating layer 302 on the sacrificial substrate 362, one or more MOSFETs on the back insulating layer 302 each formed by diffusion regions 314 as source or drain, a body region 304 as channel, a gate insulating layer 306, a gate conducting layer 308 on the gate insulating layer 306, and a spacer 310. Each of the diffusion regions 314 has a front diffusion side 314f and a back diffusion side 314b. The starting SOI wafer also comprises shallow trench isolation regions 324 to isolate two or more diffusion regions 314.

Figure 3B:
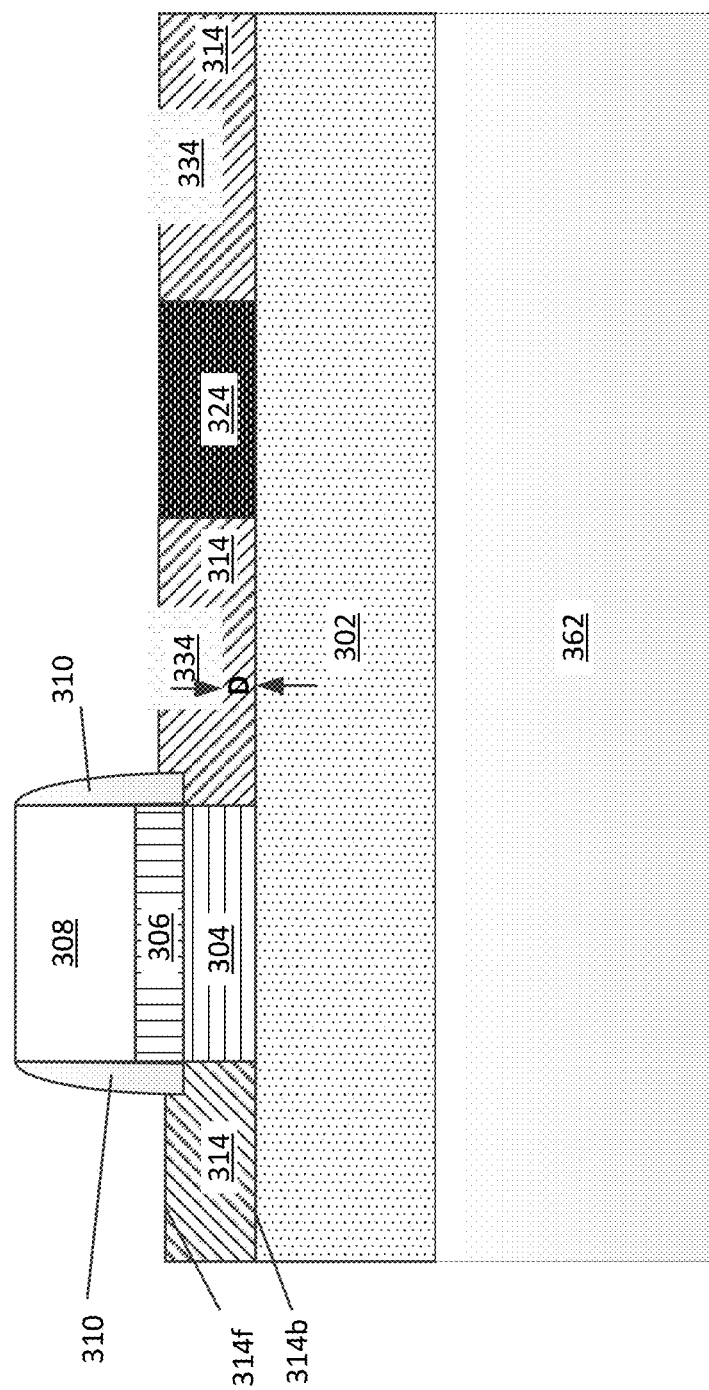

In FIG. 3b, some of the diffusion regions 314 are patterned and etched in the front diffusion sides 314f to form recesses 334 at selected recess areas. The diffusion regions 314 at the selected recess areas are thinned down to a thickness D. The thickness D is selected such that the following silicidation process would consume all diffusion silicon in the selected recess areas.

Figure 3C:
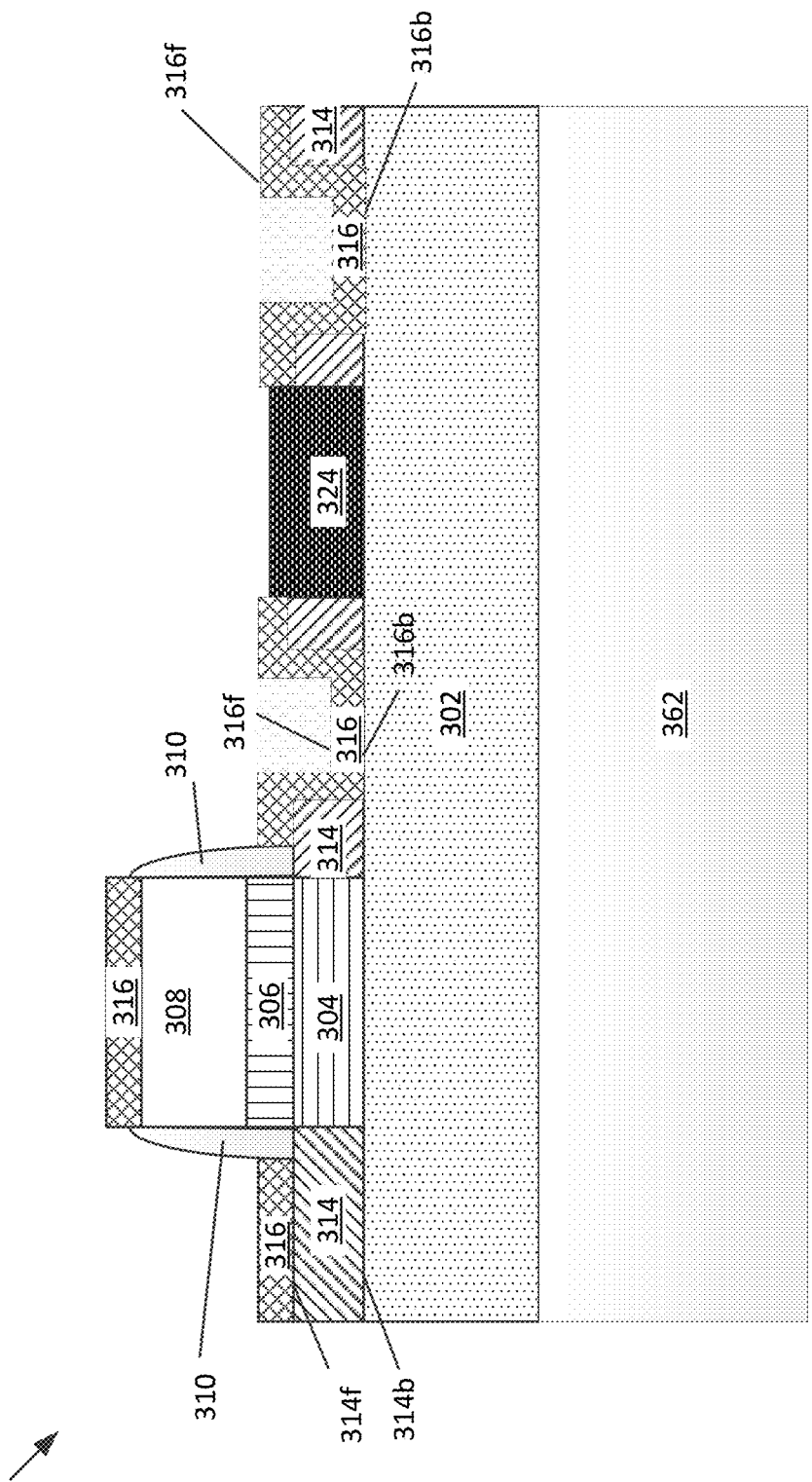

In FIG. 3c, a silicidation process is performed on the gate conducting layer 308 and on the diffusion regions 314 from the front diffusion sides 314f, including the selected recess areas. As a result, frontside silicide layers 316 is formed on the diffusion regions 314 and the gate conducting layers 308. Each of the frontside silicide layers 316 has a back silicide side 316b facing the respective diffusion regions 314 and a front silicide side 316f opposite to the back silicide side 316b.

In the selected recess areas, because the thickness of the silicon is reduced small enough, the silicidation process consumes all the remaining diffusion silicon. Both the front silicide sides 316f and the back silicide sides 316b of the respective frontside silicide layers 316 are not flat, but curve down in the selected recess areas. A portion of the front silicide sides 316f may be at the same level as, below, or above the front diffusion side 314f. For example, the portion of the front silicide sides 316f that is not in the selected recess area may be above the front diffusion sides 314f while the portion of the front silicide sides 316f that is in the selected recess area may be below the front diffusion sides 314f. Moreover, a portion of the back silicide sides 316b of the frontside silicide layers 316 touch the back insulating layer 302, such as the portion of the frontside silicide layers 316 in the selected recess areas.

Figure 3D:
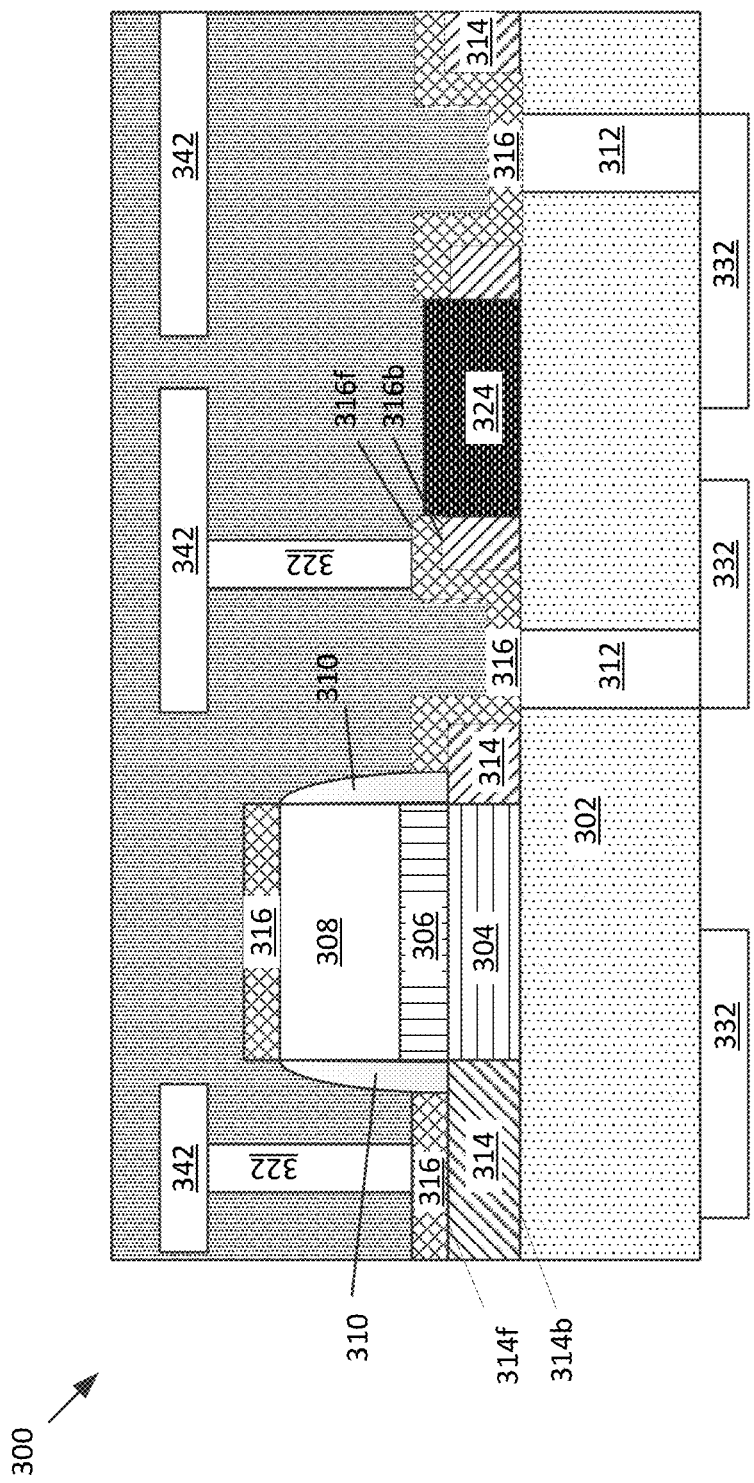

In FIG. 3d, after the formation of the frontside silicide layers 316, one or more frontside contacts 322 (e.g., comprising W, Ti, Cu, or Al) connected to the respective frontside silicide layers 316 by the front silicide side 316b and one or more front metal layers and vias 342 coupled to the frontside contacts 322. Together they form a frontside connection system.

After the formation of the frontside connection system, a handle wafer (not shown) is bonded to the starting SOI wafer. After the bonding of the handle wafer (not shown), the sacrificial substrate 362 is removed, exposing the back insulating layer 302 (which may be further thinned down). One or more backside contacts 312 (e.g., comprising W, Ti, Cu, or Al) are formed in the back insulating layer 302 and connected directly to the respective frontside silicide layers 316 by the back silicide sides 316b under the selected recess areas. As the portion of the frontside silicide layers 316 in the selected recess areas touches the back insulating layer 302, the one or more backside contacts 312 do not have to pass through the diffusion regions 314, saving the process of selective etching.

Following the formation of the backside contacts 312, one or more back metal layers and vias 332 coupled to the backside contacts 312 are formed. Together, they form a backside connection system.

As illustrated in FIG. 3d, not every frontside silicide layer has to couple to a frontside contacts. Likewise, not every frontside silicide layer has to couple to a backside contacts. In addition, a frontside silicide layer may couple to both a frontside contact and a backside contact or neither. Accordingly, recesses 334 do not have to form in every diffusion region 314. Only the diffusion regions 314 that couple to the backside connection system would form recesses 334.

Both the frontside contacts 322 and the backside contacts 312 may comprise any suitable conductive material or materials, such as W, Ti, Al, or Cu. A conductive diffusion barrier may be formed along the sidewall of the frontside contacts and/or the backside contacts. For example, Ti/TiN liner may be formed along the sidewall of the frontside contacts and/or the backside contacts.

Figure 4A:
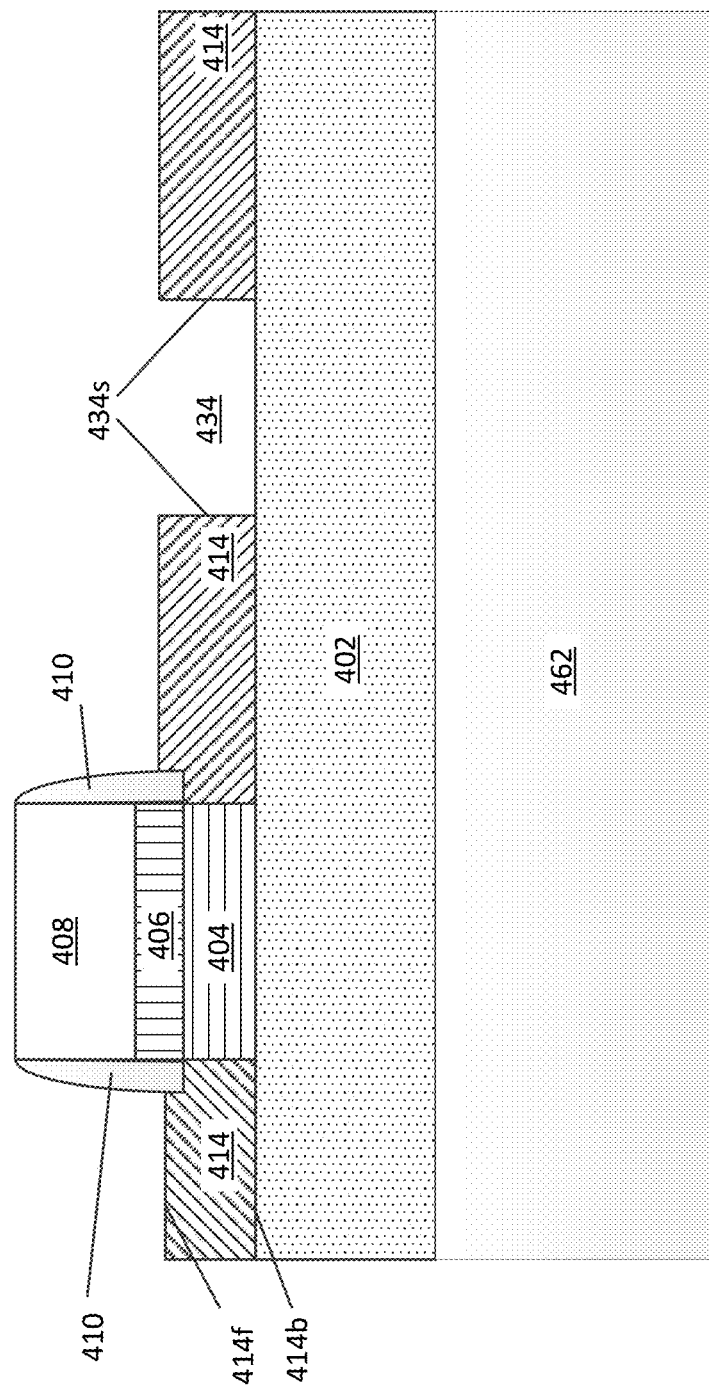
FIGS. 4a-4c illustrate yet another exemplary single-side silicide dual-side connection systems SOI device according to certain aspects of the present disclosure.
Figure 4B:
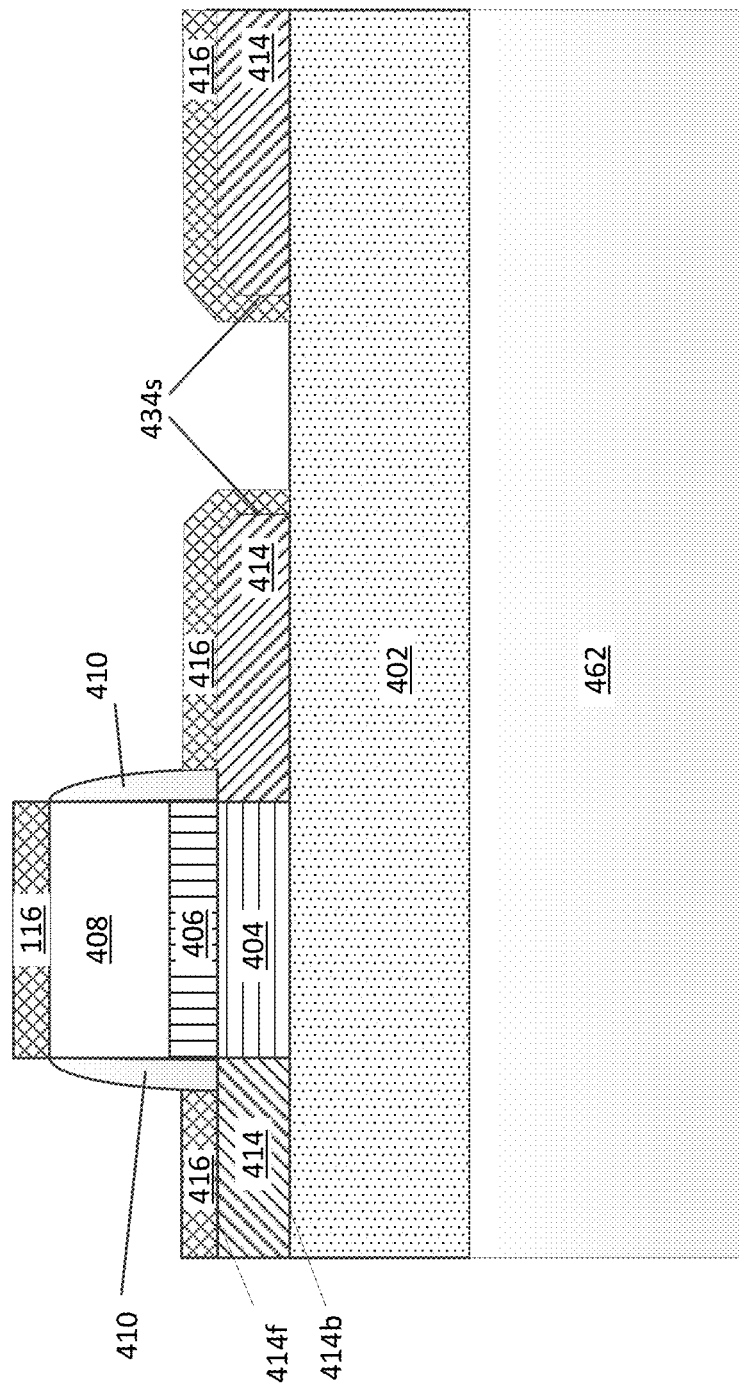
Figure 4C:
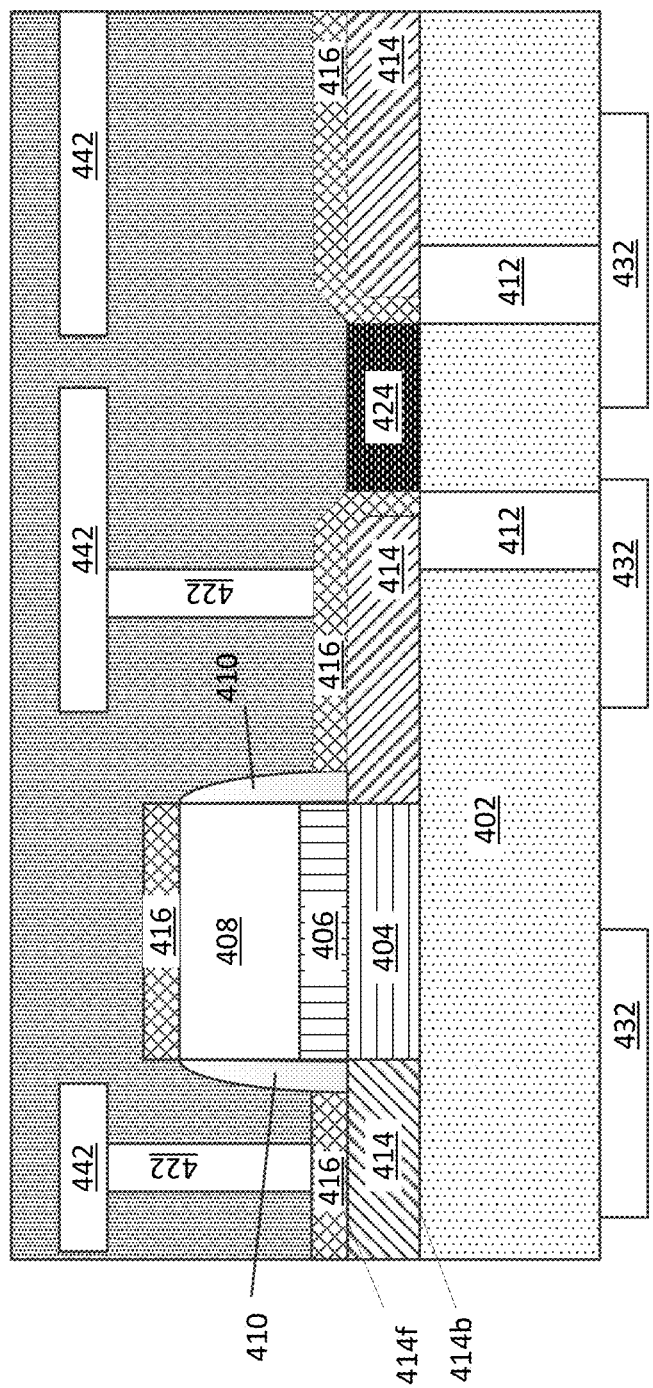

FIGS. 4a-4c illustrate yet another exemplary single-side silicide dual-side connection systems SOI device according to certain aspects of the present disclosure. In FIG. 4a, a starting SOI wafer is provided. The starting SOI wafer comprises a sacrificial substrate 462, a back insulating layer 402 on the sacrificial substrate 462, one or more MOSFETs on the back insulating layer 402 each formed by diffusion regions 414 as source or drain, a body region 404 as channel, a gate insulating layer 406, a gate conducting layer 408 on the gate insulating layer 406, and a spacer 410. Each of the diffusion regions 414 has a front diffusion side 414f and a back diffusion side 414b. In addition, one or more shallow trench isolation openings 434 exist between two or more diffusion regions 414. The one or more shallow trench isolation openings 434 are in place for shallow trench isolations that will be formed later. The sidewalls 434s of the diffusion regions 414 are the sidewalls of the respective one or more shallow trench isolation openings 434, too.

In FIG. 4b, a silicidation process is performed on the gate conducting layer 408 and on the diffusion regions 414 from the front diffusion sides 414f, including the sidewalls 434s in the one or more shallow trench isolation openings 434. As a result, frontside silicide layers 416 are formed on the diffusion regions 414 and the gate conducting layers 408. In the one or more shallow trench isolation openings 434, the frontside silicide layers 416 are also form at the sidewalls 434s and end at the back insulating layer 402.

In FIG. 4c, after the formation of the frontside silicide layers 416, the one or more shallow trench isolation openings 434 are filled with dielectric materials (e.g., SiO2) to form shallow trench isolation regions 424. One or more frontside contacts 422 (e.g., comprising W, Ti, Cu, or Al) are formed to connect to the respective frontside silicide layers 416. One or more front metal layers and vias 442 are formed to couple to the frontside contacts 422. Together they form a frontside connection system.

After the formation of the frontside connection system, a handle wafer (not shown) is bonded to the starting SOI wafer. After the bonding of the handle wafer (not shown), the sacrificial substrate 462 is removed, exposing the back insulating layer 402 (which may be further thinned down). One or more backside contacts 412 (e.g., comprising W, Ti, Cu, or Al) are formed in the back insulating layer 402 and connected directly to the respective frontside silicide layers 416 by the sidewalls 434s. As the portion of the frontside silicide layers 416 at the sidewalls 434s touches the back insulating layer 302, the one or more backside contacts 412 do not have to pass through the diffusion regions 314, saving the process of selective etching.

Following the formation of the backside contacts 412, one or more back metal layers and vias 432 coupled to the backside contacts 412 are formed. Together they form a backside connection system.

As illustrated in FIG. 4c, not every frontside silicide layer has to couple to a frontside contacts. Likewise, not every frontside silicide layer has to couple to a backside contacts. In addition, a frontside silicide layer may couple to both a frontside contact and a backside contact or neither.

Both the frontside contacts 422 and the backside contacts 412 may comprise any suitable conductive material or materials, such as W, Ti, Al, or Cu. A conductive diffusion barrier may be formed along the sidewall of the frontside contacts and/or the backside contacts. For example, Ti/TiN liner may be formed along the sidewall of the frontside contacts and/or the backside contacts.

Figure 5:
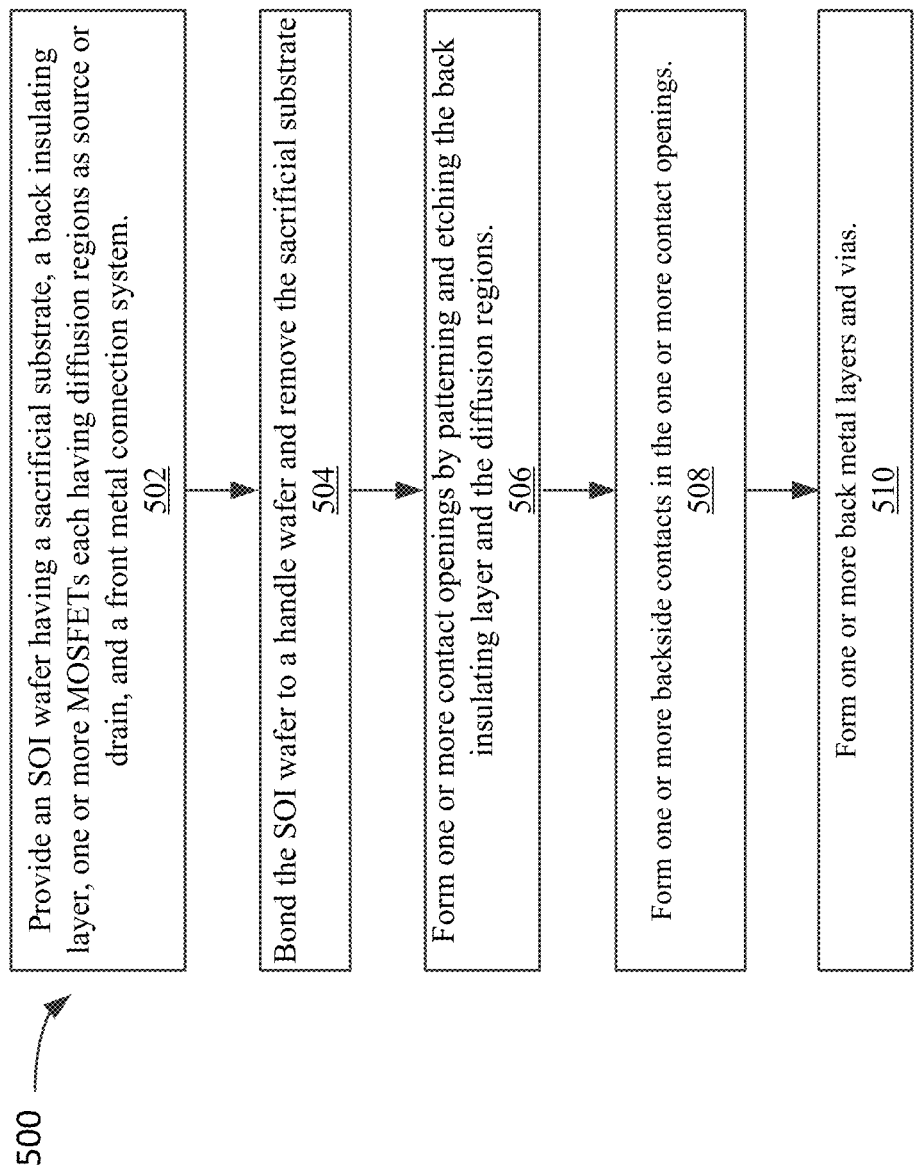
FIG. 5 illustrates an exemplary method 500 in making an exemplary single-side silicide dual-side connection systems SOI device according to certain aspects of the present disclosure.

FIG. 5 illustrates an exemplary method 500 in making an exemplary single-side silicide dual-side connection systems SOI device according to certain aspects of the present disclosure. At 502, a starting SOI wafer is provided. The starting SOI wafer comprises a sacrificial substrate, a back insulating layer (e.g., the back insulating layer 302), one or more MOSFETs on the insulating layer each formed by diffusion regions (e.g., the diffusion regions 214) as source or drain, a body region (e.g., the body region 204) as channel, a gate insulating layer (e.g., the gate insulating layer 206), a gate conducting layer (e.g., the gate conducting layer 208) on the gate insulating layer, and a spacer (e.g., the spacer 210). The starting SOI wafer also comprises a sacrificial substrate and shallow trench isolation regions (e.g., the shallow trench isolation regions 224) to isolate two or more diffusion regions. Frontside silicide layers (e.g., the frontside silicide layers 216) are formed in and on the diffusion regions and the gate insulating layers. One or more frontside contacts (e.g., the frontside contacts 222) connect to the respective frontside silicide layers. One or more front metal layers and vias (e.g., the front metal layers and vias 242) couple to the frontside contacts. The frontside contacts and the front metal layers and vias together form a frontside connection system.

At 504, the SOI wafer is bonded to a handle wafer. The sacrificial substrate is then removed, exposing the back insulating layer (which may be further thinned down).

At 506, one or more contact openings are formed by patterning and etching the back insulating layer and the diffusion regions. The one or more contact openings are formed under the diffusion regions. The openings have to be through a portion of the diffusion regions and stop at the frontside silicide layers. This requires selectively etching diffusion silicon under the frontside silicide layers. Additional end-point sensing may be needed for control to avoid over or under etching.

At 508, one or more backside contacts (e.g., the backside contacts 212) are formed in the one or more contact openings. The backside contacts connect low resistively to the diffusion regions through the frontside silicide layers.

At 510, one or more back metal layers and vias (e.g., the back metal layers and vias 232) are formed to couple to the backside contacts and together form a backside connection system for the SOI device.

Figure 6:
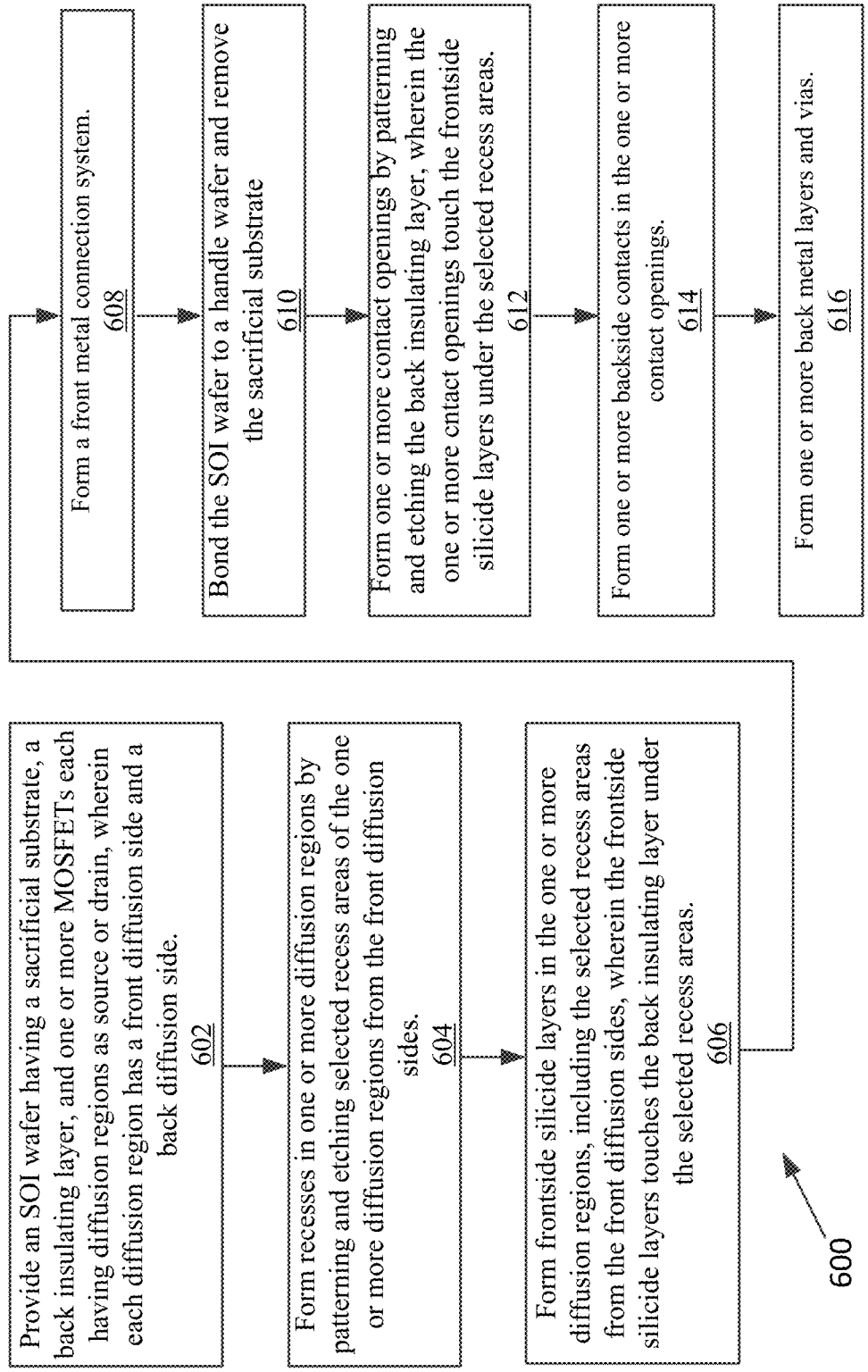
FIG. 6 illustrates another exemplary method 600 in making an exemplary single-side silicide dual-side connection systems SOI device according to certain aspects of the present disclosure

FIG. 6 illustrates another exemplary method 600 in making an exemplary single-side silicide dual-side connection systems SOI device according to certain aspects of the present disclosure. At 602, a starting SOI wafer is provided. The starting SOI wafer comprises a sacrificial substrate (e.g., the sacrificial substrate 362), a back insulating layer (e.g., the back insulating layer 302) on the sacrificial substrate, one or more MOSFETs on the insulating layer each formed by diffusion regions (e.g., the diffusion regions 314) as source or drain, a body region (e.g., the body region 304) as channel, a gate insulating layer (e.g., the gate insulating layer 306), a gate conducting layer (e.g., the gate conducting layer 308) on the gate insulating layer, and a spacer (e.g., the spacer 310). Each of the diffusion regions has a front diffusion side and a back diffusion side. The starting SOI wafer may also comprise shallow trench isolation regions (e.g., the shallow trench isolation regions 324) to isolate two or more diffusion regions.

At 604, one or more diffusion regions are patterned and etched from the front diffusion sides to form recesses (e.g., the recesses 334) at selected recess areas. The diffusion regions at the selected recess areas are thinned down to a thickness D. The thickness D is such that the following silicidation process would consume all diffusion silicon in the selected recess areas.

At 606, a silicidation process is performed in the diffusion regions from the front diffusion sides to form frontside silicide layers (e.g., the frontside silicide layers 316), including the selected recess areas. In the selected recess areas, because the thickness of the diffusion silicon is reduced small enough, the frontside silicide layers touch the back insulating layer.

At 608, a front metal connection system is formed, including frontside contacts (e.g., the frontside contacts 322) coupled to the frontside silicide layers and one or more front metal layers and vias coupled to the frontside contacts. (e.g., the front metal layers and vias 342).

At 610, the starting SOI wafer is bonded to a handle wafer. The sacrificial substrate is then removed, exposing the back insulating layer (which may be further thinned down).

At 612, one or more contact openings are formed by patterning and etching the back insulating layer. The one or more contact openings are formed under the selected recess areas of the diffusion regions. The one or more contact openings touch the frontside silicide layers under the selected recess areas.

At 614, one or more backside contacts (e.g., the backside contacts 312) are formed in the one or more contact openings. The backside contacts connect low resistively to the diffusion regions through the frontside silicide layers.

At 616, one or more back metal layers and vias (e.g., the back metal layers and vias 332) coupled to the backside contacts are formed. Together they form a backside connection system for the SOI device.

Figure 7:
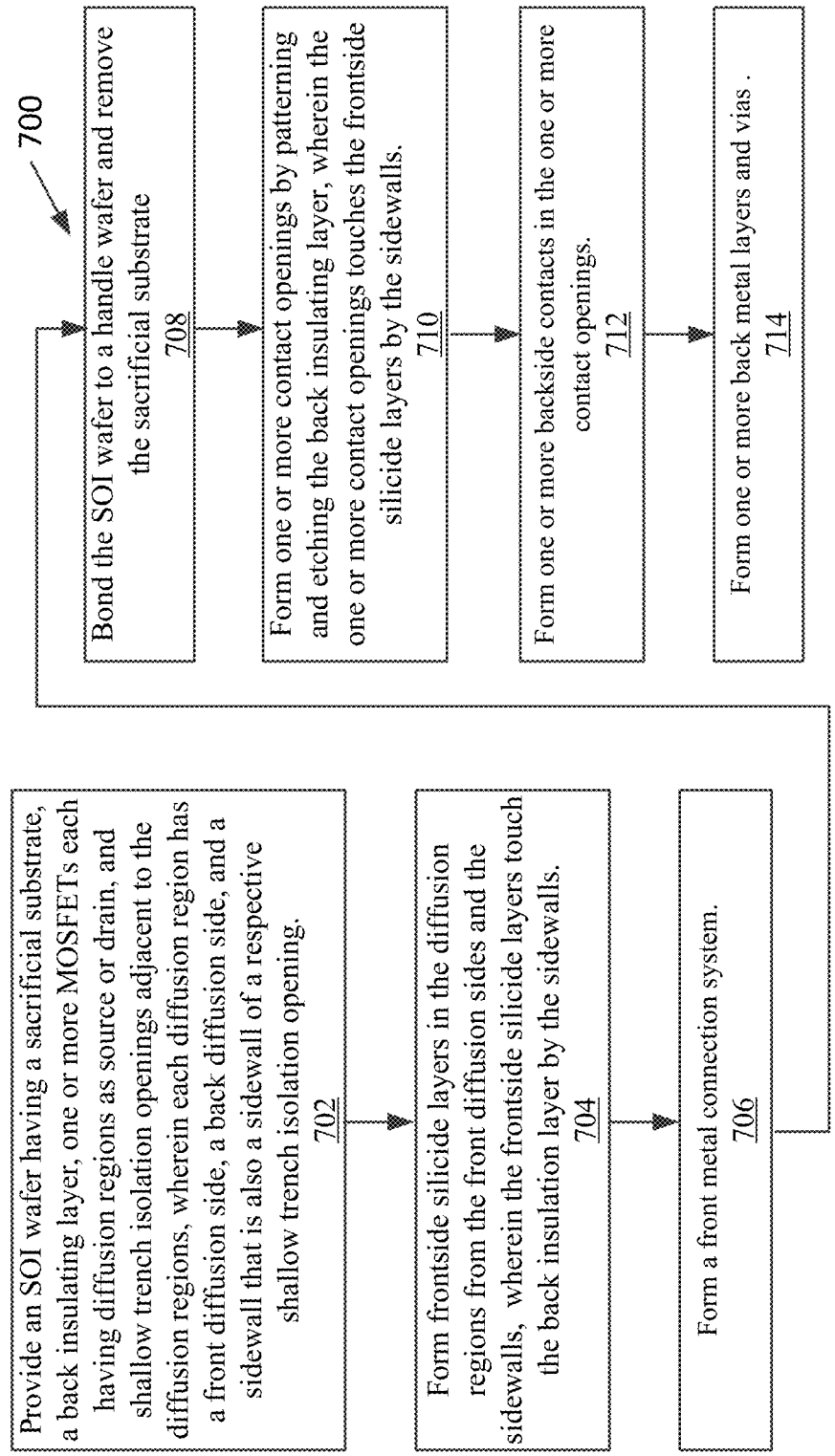
FIG. 7 illustrates yet another exemplary method 700 in making an exemplary single-side silicide dual-side connection systems SOI device according to certain aspects of the present disclosure.

FIG. 7 illustrates yet another exemplary method 700 in making an exemplary single-side silicide dual-side connection systems SOI device according to certain aspects of the present disclosure. At 702, a starting SOI wafer is provided. The starting SOI wafer comprises a sacrificial substrate (e.g., the sacrificial substrate 462), a back insulating layer (e.g., the back insulating layer 402) on the sacrificial substrate, one or more MOSFETs on the insulating layer each formed by diffusion regions (e.g., the diffusion regions 414) as source or drain, a body region (e.g. the body region 404) as channel, a gate insulating layer (e.g., the gate insulating layer 406), a gate conducting layer (e.g., the gate conducting layer 408) on the gate insulating layer, and a spacer (e.g., the spacer 410). Each of the diffusion regions has a front diffusion side and a back diffusion side. In addition, one or more shallow trench isolation openings (e.g., the shallow trench isolation openings 434) exist between two or more diffusion regions. The one or more shallow trench isolation openings are in place for shallow trench isolations that will be formed later. The sidewalls (e.g., the sidewalls 434s) of the diffusion regions are the sidewalls of the one or more shallow trench isolation openings, too.

At 704, a silicidation process is performed on the gate conducting layer and on the diffusion regions from the front diffusion sides, including sidewalls in the one or more shallow trench isolation openings. As a result, frontside silicide layers (e.g., the frontside silicide layers 416) are formed in the diffusion regions from the front diffusion sides and the sidewalls. The frontside silicide layers formed by the sidewalls touches the back insulating layer.

After the formation of the frontside silicide layers, the shallow trench isolation openings are filled with dielectric materials. A front metal connection system is then formed at 706, including frontside contacts (e.g., the frontside contacts 422) connected to the frontside silicide layers and one or more front metal layers and vias (e.g., the front metal layers and vias 442) coupled to the frontside contacts.

After the formation of the frontside connection system, at 708, a handle wafer is bonded to the starting SOI wafer at the front side. The sacrificial substrate is then removed, exposing the back insulating layer (which may be further thinned down).

At 710, one or more contact openings are formed by patterning and etching the back insulating layer. The one or more contact openings are formed under the diffusion regions. The one or more contact openings touch the frontside silicide layers by the sidewalls.

At 712, one or more backside contacts (e.g., the backside contacts 412) are formed in the one or more contact openings. The backside contacts connect low resistively to the diffusion regions through the frontside silicide layers by the sidewalls.

At 714, one or more back metal layers and vias (e.g., the back metal layers and vias 432) coupled to the backside contacts are formed and together form a backside connection system.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   A silicon-on-insulator (SOI) MOSFET having a diffusion region as source or drain on a back insulating layer, wherein the diffusion region has a front diffusion side and a back diffusion side opposite to the front diffusion side;
   a silicide layer on the front diffusion side having a back silicide side facing the diffusion region and a front silicide side opposite to the back silicide side, wherein a portion of the back silicide side touches the back insulating layer and another portion of the back silicide side does not touch the back insulating layer; and
   a backside contact connected to the silicide layer by the portion of the back silicide side that touches the back insulating layer.

2. The apparatus of claim 1, wherein the silicide layer is conforming with the front diffusion side.

3. The apparatus of claim 1, wherein the diffusion region has a sidewall adjacent to a shallow trench isolation region and a portion of the silicide layer is by the sidewall.

4. The apparatus of claim 3, wherein the backside contact connects to the portion of the silicide layer by the sidewall.

5. The apparatus of claim 1, further comprising a frontside contact connected to the silicide layer by the front silicide side.

6. The apparatus of claim 5, further comprising one or more metal layers and vias coupled to the frontside contact.

7. The apparatus of claim 1, further comprising one or more metal layers and vias coupled to the backside contact.

8. The apparatus of claim 1, wherein the backside contact comprises Ti, W, Al, or Cu.

9. The apparatus of claim 1, wherein a portion of the front silicide side is above the front diffusion side and a portion of the front silicide side is below the front diffusion side.

10. The apparatus of claim 9, wherein the portion of the back silicide side that touches the back insulating layer is opposite the portion of the front silicide side that is below the front diffusion side.

* * * * *